(12) United States Patent
Kang et al.

(10) Patent No.: US 7,753,567 B2
(45) Date of Patent: Jul. 13, 2010

(54) BACKLIGHT UNIT FOR TEST DEVICE OF LCD PANEL

(75) Inventors: Dong Woo Kang, Gumi-si (KR); Soung Yeoul Eom, Gumi-si (KR); Bong Chul Kim, Daegu-si (KR); Ki Soub Yang, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 602 days.

(21) Appl. No.: 11/442,219

(22) Filed: May 30, 2006

(65) Prior Publication Data

US 2007/0047239 A1  Mar. 1, 2007

(30) Foreign Application Priority Data

Sep. 1, 2005  (KR) .................. 10-2005-0081403

(51) Int. Cl.
*B60Q 1/06*  (2006.01)
(52) U.S. Cl. ................... 362/373; 362/294; 362/97.1
(58) Field of Classification Search ........... 326/294, 326/373, 97, 252, 249; 349/61–71

See application file for complete search history.

(56) References Cited

U.S. PATENT DOCUMENTS

| | | | |
|---|---|---|---|
| 2005/0254013 A1* | 11/2005 | Engle et al. ................ 353/52 |
| 2006/0034085 A1* | 2/2006 | Wang et al. ................ 362/294 |
| 2006/0133090 A1* | 6/2006 | Noh et al. .................. 362/294 |
| 2006/0198161 A1* | 9/2006 | Lin ............................ 362/613 |
| 2006/0214174 A1* | 9/2006 | Shirakuma et al. ......... 257/89 |
| 2006/0221574 A1* | 10/2006 | Song et al. ................. 361/704 |
| 2006/0262079 A1* | 11/2006 | Seong et al. ............... 345/102 |
| 2006/0262571 A1* | 11/2006 | Chen .......................... 362/632 |

\* cited by examiner

*Primary Examiner*—Jong-Suk (James) Lee
*Assistant Examiner*—Julie A Shallenberger
(74) *Attorney, Agent, or Firm*—McKenna Long & Aldridge LLP

(57) ABSTRACT

A backlight unit for a test device of an LCD panel is disclosed. The backlight unit includes: a chamber enclosing a predetermined space, the chamber being provided with a plurality of through holes formed around the chamber perimeter to allow air flow between the interior and exterior of the chamber; a backlight provided in the chamber to emit a light to an LCD panel positioned in the chamber; and a plurality of circulating fans provided in the chamber to circulate air inside the chamber.

12 Claims, 12 Drawing Sheets

BACKLIGHT UNIT FOR TEST DEVICE OF LCD PANEL

This application claims the benefit of Korean Patent Application No. 10-2005-0081403, filed on Sep. 1, 2005, which is hereby incorporated by reference for all purposes as if fully set forth herein.

BACKGROUND OF THE INVENTION

1. Field of the Invention

The present invention relates to a test device for a liquid crystal display (LCD) panel, and more particularly, to a backlight unit having increased lifetime for an LCD panel test device.

2. Discussion of the Related Art

One type of test device of the related art for a liquid crystal display (LCD) panel allows a naked eye evaluation of whether the LCD panel is bad or good.

FIGS. 1 and 2 illustrate a related art test device for an LCD panel.

As shown in FIGS. 1 and 2, the related art test device for an LCD panel includes a tester 2 and a loading/unloading unit 7. The tester 2 is arranged at one side of a main body 1 to test an LCD panel 10. The loading/unloading unit 7 is arranged at one side of the tester 2, and receives and stores an LCD panel 10 to be tested.

The related art test device of the LCD panel further includes a carrier 9 arranged to be movable in left and right directions to carry the LCD panel 10 from the loading/unloading unit 7 to the tester 2 and vice versa.

The tester 2 includes a probe unit 3 and a work table 4. The work table 4 contacts the LCD panel 10 with the probe unit 3 and supplies a light source. The work table 4 includes a polarizing plate 4a and a backlight 4b. A moving stage 5 is arranged at the rear of the work table 4, and serves to align the work table 4 with respect to the probe unit 3 and to move the work table 4 into contact with the probe unit 3.

The loading/unloading unit 7 is provided with a sub table 8 that tilts the LCD panel 10 carried from a loader (not shown) at a predetermined angle (for example, 60°).

In addition, a microscope 6 is arranged at the front of the tester 2. The microscope may be moved in all directions. The microscope 6 serves to allow a worker to perform a more detailed inspection of the LCD panel 10 when a defect is found in the LCD panel using the naked eye.

A test process using the related art test device for an LCD panel will now be described in brief.

First, the LCD panel 10 is transferred from the loader of the loading/unloading unit 7 to the sub table 8. The sub table 8 is tilted at a predetermined angle and the LCD panel 10 is transferred to the carrier 9. The carrier 9 carries the LCD panel 10 to the tester 2. When the LCD panel 10 to be tested is positioned in the tester 2, the moving stage drives the work table 4 forward and the LCD panel 10 is fixed to the carrier 9 using a vacuum. A pad (not shown) of the fixed LCD panel 10 is electrically connected to a lead pin (not shown) of the probe unit 3.

Once the LCD panel 10 is electrically connected with the probe unit 3, a predetermined image signal is applied through the probe unit 3 while a lamp of the backlight 4b is varied using various patterns provided by a pattern generator. The pattern generator is an external image signal input device. The worker can identify a defect of the panel by viewing the displayed pattern from the LCD panel 10 with the naked eye.

However, the related art test device of the LCD panel has the following problems.

First, in the related art test device of the LCD panel, a cold fluorescent lamp (CFL) or a cold cathode fluorescent lamp (CCFL) is used as the backlight 4b. However, these types of backlight 4b have a problem in that frequent blinking on and off these lamp types rapidly decreases the lifetime of the lamp. The shortened lifetime results in the backlight 4b having to be frequently replaced increasing the cost of operating the tester.

In addition, the lifetime of the backlight 4b is decreased due to heating of the backlight 4b by heat generated during operation of the backlight 4b.

As the light source nears the end of its life, the light source may fail to illuminate particular portions of the LCD panel (for example, corner portions) during a test of the LCD panel. As a result, a defect in the particular portion of the LCD panel may not be effectively detected.

SUMMARY OF THE INVENTION

Accordingly, the present invention is directed to a backlight unit for a test device of a liquid crystal display (LCD) panel, which substantially obviates one or more of the problems due to limitations and disadvantages of the related art.

An advantage of the present invention is to provide a backlight unit for a test device of an LCD panel, in which heat generated by emission of the backlight is removed to increase the lifetime of the backlight unit.

Another advantage of the present invention is to provide a backlight unit for a test device of an LCD panel, in which a light source is uniformly supplied to the LCD panel to prevent brightness deviations from occurring.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a backlight unit for a test device of an LCD panel includes: a chamber having a predetermined space therein, provided with a plurality of through holes formed around the chamber perimeter to communicate between a space inside chamber space and a space exterior to the chamber; a backlight provided in the chamber to emit a light to an LCD panel positioned in the chamber; and a plurality of circulating fans provided in the chamber to circulate air inside the chamber.

In another aspect of the present invention, a backlight unit for a test device of an LCD panel includes: a chamber having a predetermined space therein; a plurality of high-brightness LEDs provided inside the chamber to emit a light to the LCD panel; a PCB substrate packaged with the respective high-brightness LEDs; and a refrigerant pipe provided inside the chamber to flow a refrigerant of a low temperature therein.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

A backlight unit for a test device of a liquid crystal display (LCD) panel according to embodiments of the present invention will be described with reference to FIGS. 3 to 13.

Figure 1:
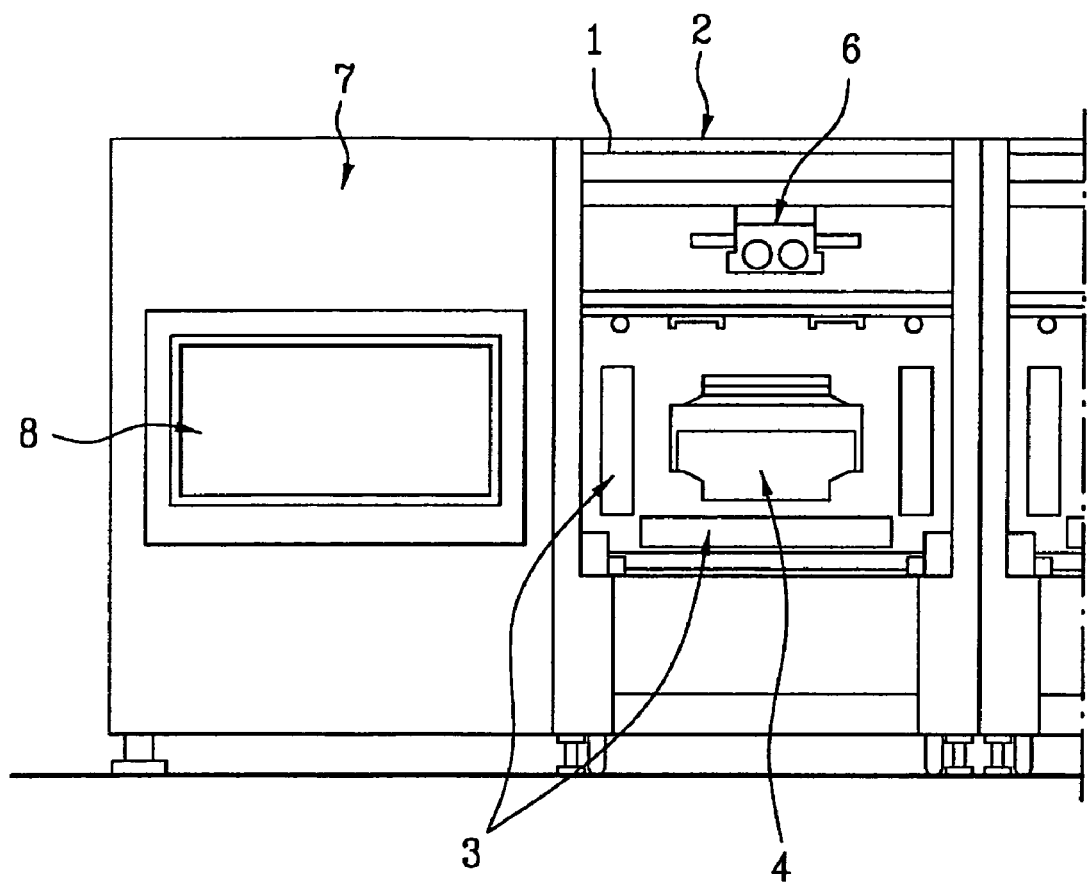
FIG. 1 is a front view illustrating one example of a related art test device of a liquid crystal display (LCD) panel.
Figure 2:
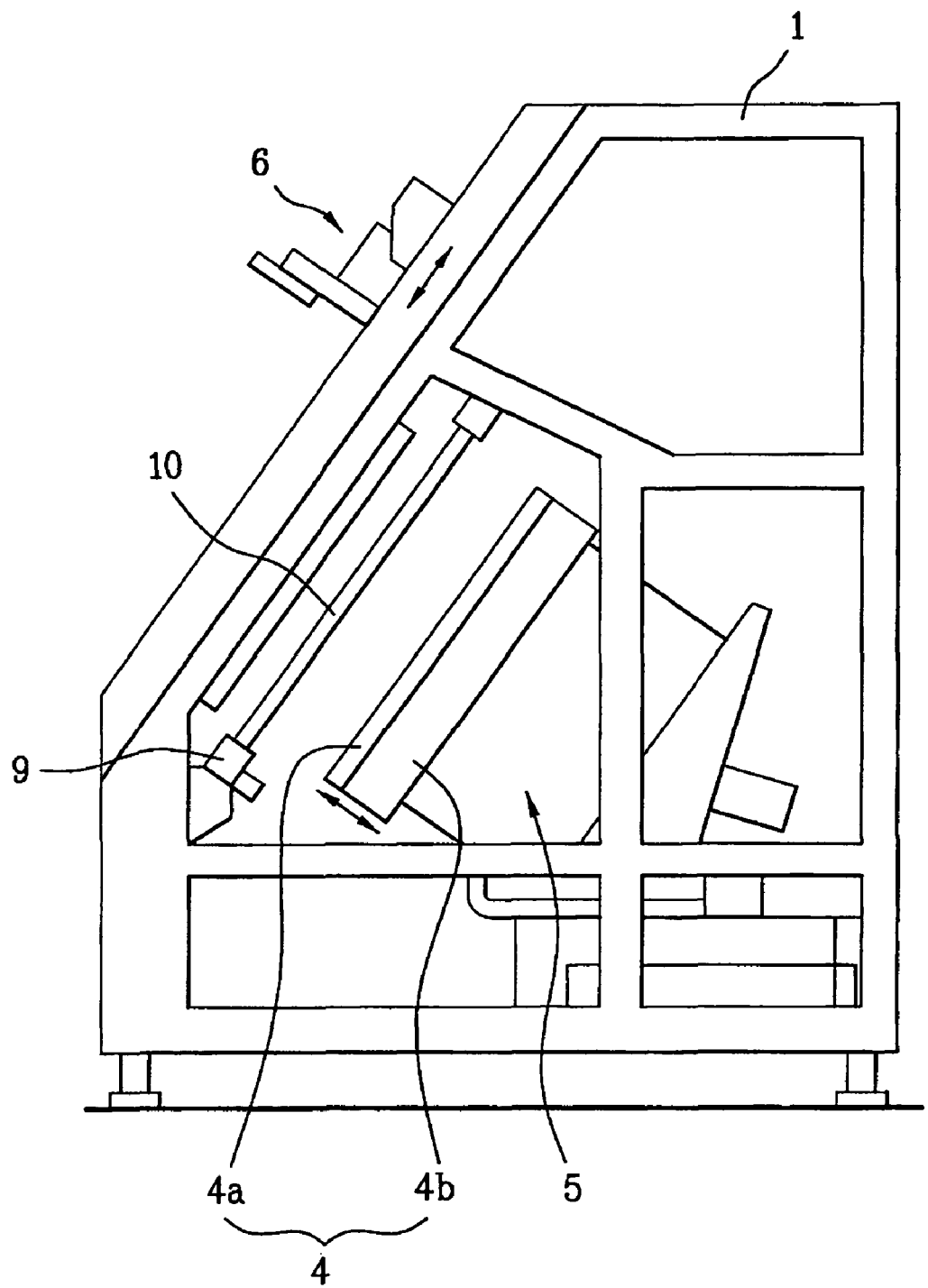
FIG. 2 is a side view illustrating a related art test device of an LCD panel shown in FIG. 1.
Figure 3:
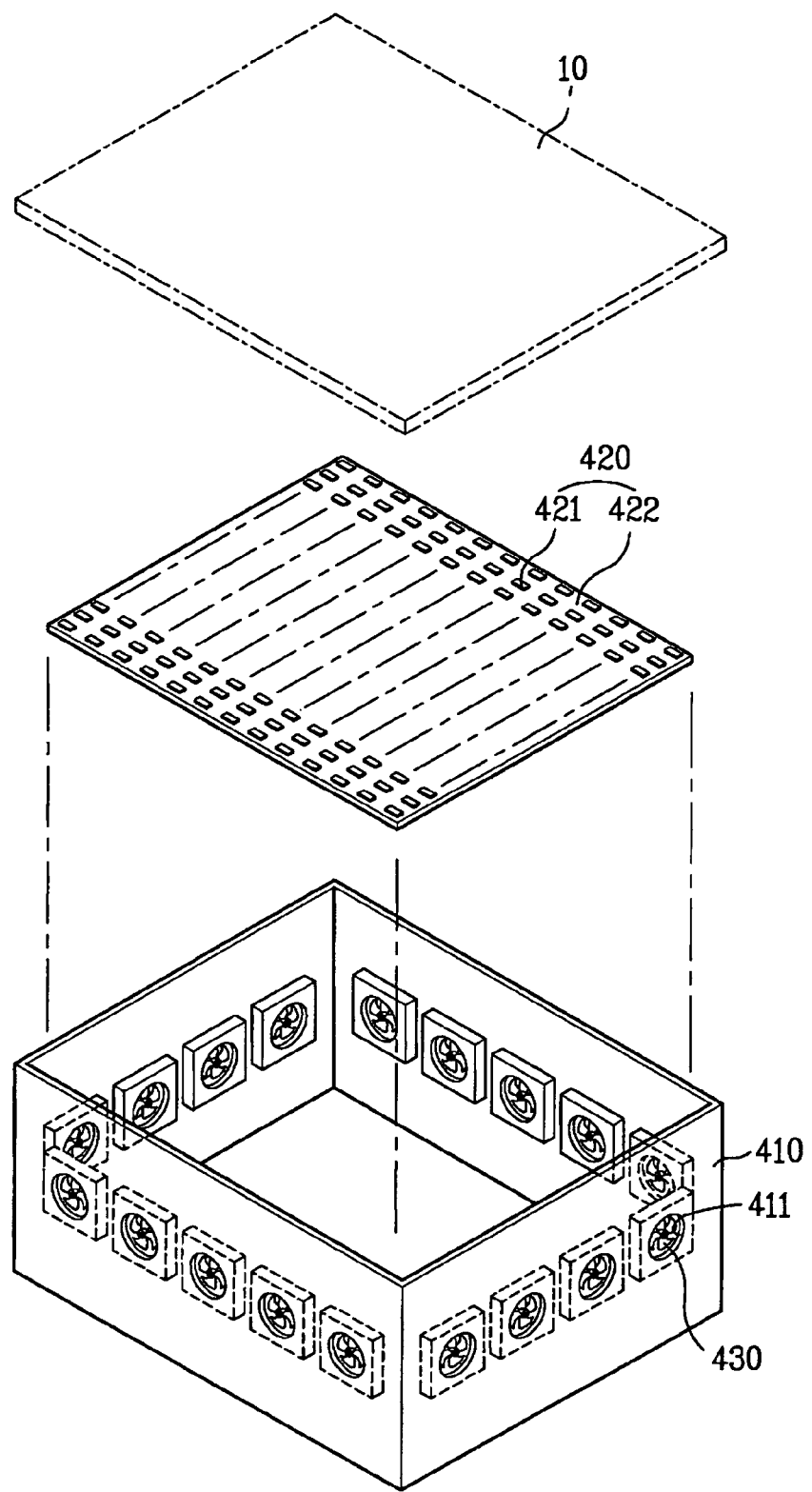
FIG. 3 is an exploded perspective view illustrating a backlight unit for a test device of an LCD panel according to the first embodiment of the present invention.
Figure 4:
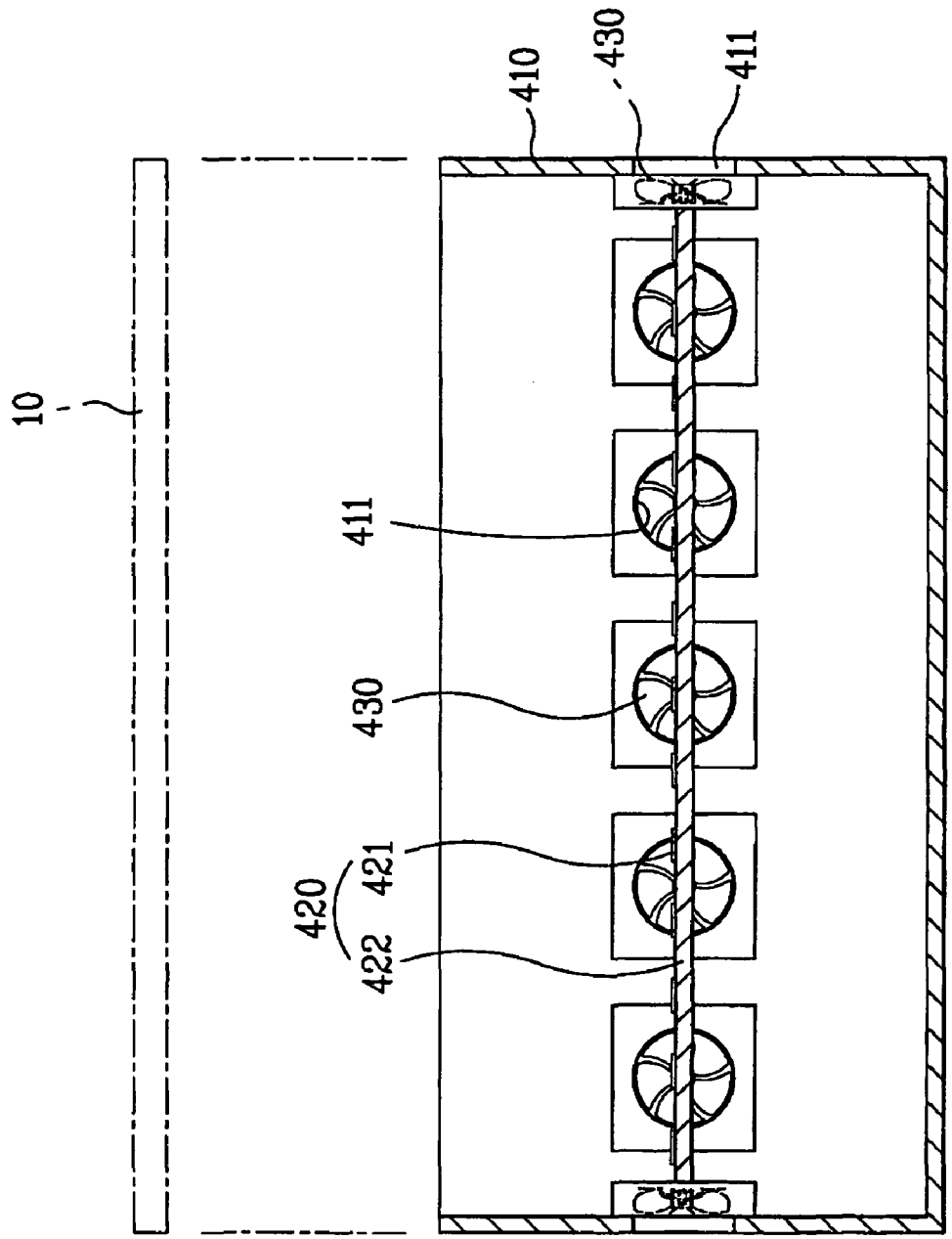
FIG. 4 is a side sectional view illustrating a backlight unit for a test device of an LCD panel according to the first embodiment of the present invention.

FIGS. 3 and 4 are an exploded perspective view and a side sectional view illustrating a backlight unit for a test device of an LCD panel according to a first embodiment of the present invention.

As shown in FIGS. 3 and 4, the backlight unit for a test device of an LCD panel according to the first embodiment of the present invention includes a chamber 410, a backlight 420, and a plurality of circulating fans 430.

The chamber 410 has a rectangular box shape having a predetermined volume therein, with an open top surface. The chamber 410 is provided with a plurality of through holes 411 along the perimeter of the chamber 410. An inner space of the chamber 410 communicates with its outer space through the through holes 411.

The through holes 411 may be formed along the entire of the perimeter of the chamber 410, along two opposing portions of the perimeter, or along one portion of the perimeter.

Alternatively, the chamber 410 may have a cylindrical shape or a polygonal box shape having a plurality of corners.

A backlight 420 is provided inside the chamber 410. The backlight 420 comprises a plurality of lamps that emit light to illuminate the LCD panel 10.

The backlight 420 may be provided at an upper space inside the chamber 410.

When the backlight 420 is provided at an upper space inside the chamber 410, the space at the lower interior of the chamber 410 may be maintained empty to facilitate the flow the air through inside the chamber 410.

In addition, the backlight 420 may include of any one of cold fluorescent lamps (CFLs), cold cathode fluorescent lamps (CCFLs), external electrode fluorescent lamps (EEFLs), and high-brightness LEDs.

In FIGS. 3 and 4, the backlight 420 is illustrated as comprising a plurality of high-brightness LEDs 421.

By employing high-brightness LEDs as the backlight 420, the lifetime of the backlight unit does not decrease with frequent blinking on and off the backlight 420, minimizing brightness deviation in regions such as the corner of the LCD panel.

Each high-brightness LED 421 is packaged on a PCB substrate 422, and the PCB substrate 422 is mounted in the chamber 410. The PCB substrate 422 is designed to support each high-brightness LED 421 in the chamber 410 and to provide various signals and power to each high-brightness LED 421.

The circulating fans 430 are provided inside the chamber 410, and may be arranged to vent the air outside the chamber 410 toward the inside of the chamber 410 through the through holes 411.

It is to be understood that the circulating fans 430 may be arranged to vent the air inside the chamber 410 toward the outside of the chamber 410. Alternatively, some circulating fans 430 may be arranged to vent the air outside the chamber 410 toward the inside of the chamber 410 while other circulating fans 430 are arranged to vent the air inside the chamber 410 toward the outside of the chamber 410. The number circulating fans 430 may be varied.

A circulating fan 430 may be provided for each through hole 411. Each through hole 411 may have a diameter substantially identical with an air flow opening of a respective circulating fan 430.

Hereinafter, the operation of the aforementioned backlight unit according to the first embodiment of the present invention including its air circulating operation will be described.

First, when the backlight unit is controlled to test the LCD panel 10, each high-brightness LED 421 is operated to emit light.

The light emitted from each high-brightness LED 421 is irradiated into the LCD panel 10. A signal for displaying various patterns is supplied to the LCD panel 10, and as a result, various images are displayed in the LCD panel 10.

While the high-brightness LED 421 is emitting light, each of the circulating fans 430 is driven to circulate air.

Air from outside of the chamber 410 is vented into the chamber 410 through through holes 411 to circulate air onto each high-brightness LED 421 and onto the PCB substrate 422 inside the chamber 410.

The circulating air provides a cooling effect minimizing damage to the various circuits on the PCB substrate 422 due to heat generated by the high-brightness LEDs 421.

Further, when the aforementioned backlight 420 comprises high-brightness LEDs 421, the lifetime of the backlight 420 is preserved even when the backlight are blinked frequently to test the LCD panel 10 or due to other demands to blink the LEDs 421.

Figure 5:
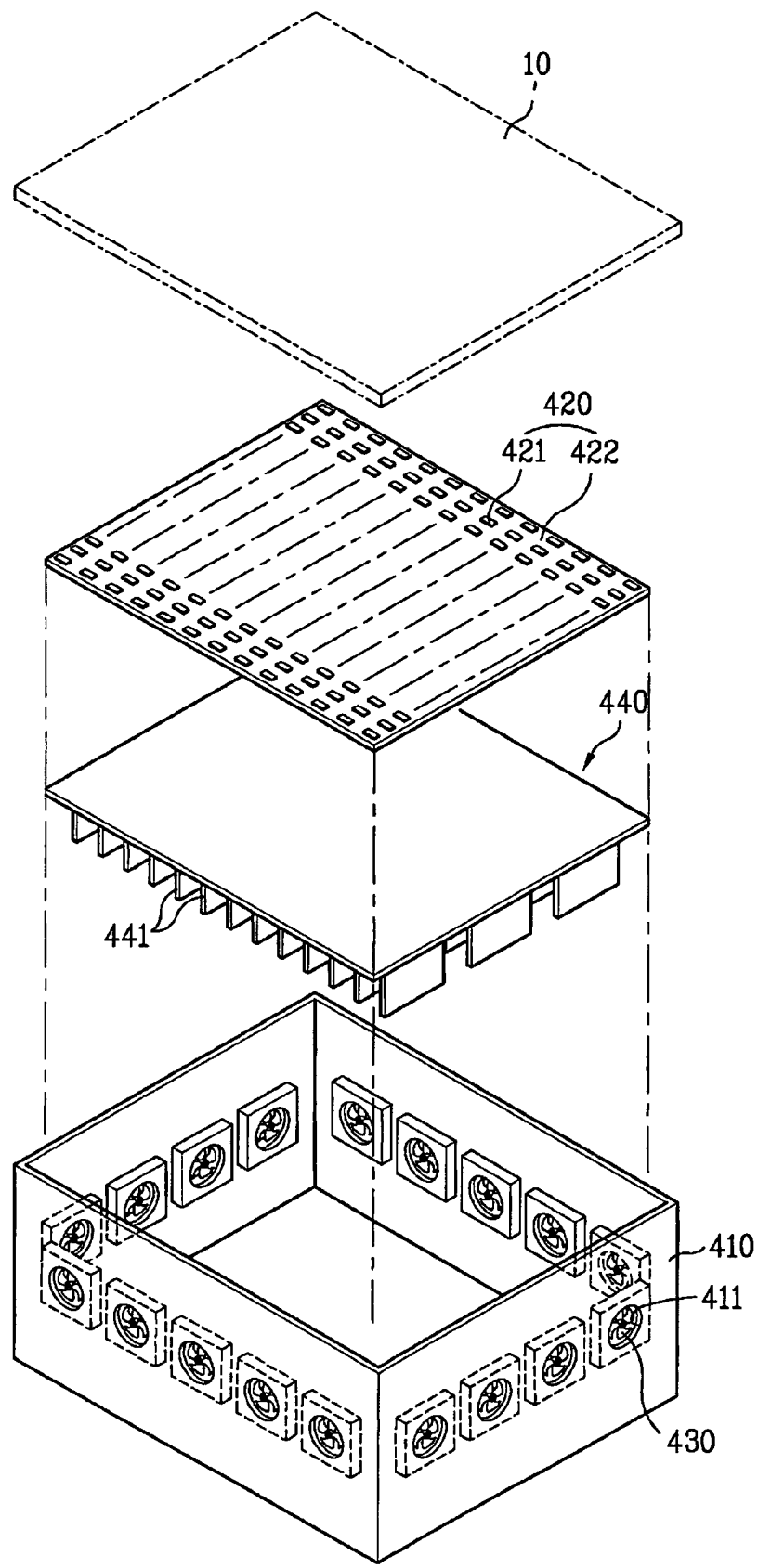
FIG. 5 is an exploded perspective view illustrating a backlight unit for a test device of an LCD panel according to the second embodiment of the present invention.
Figure 6:
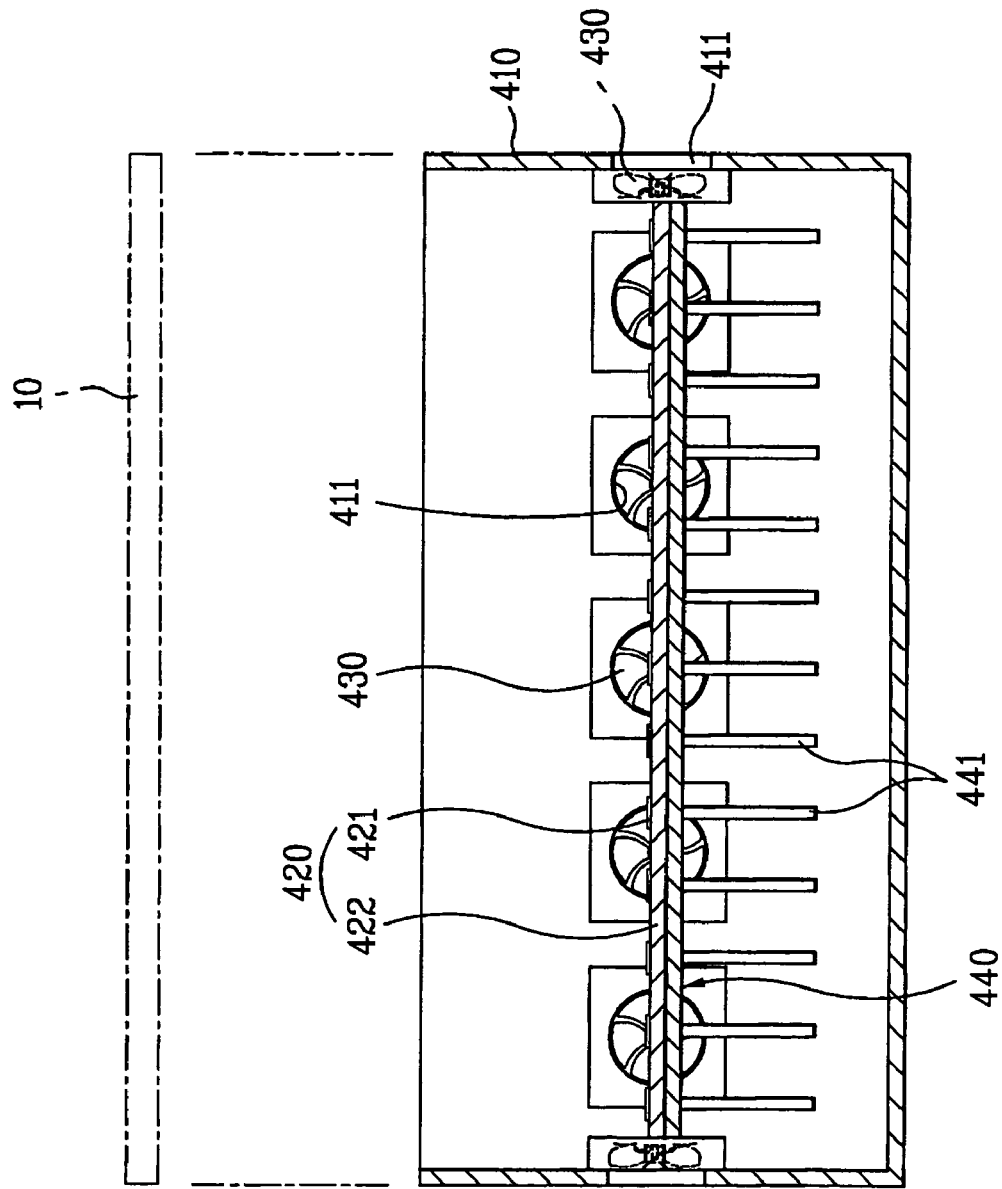
FIG. 6 is a side sectional view illustrating a backlight unit for a test device of an LCD panel according to the second embodiment of the present invention.

FIGS. 5 and 6 illustrate a backlight unit according to a second embodiment of the present invention.

As shown in FIGS. 5 and 6, the backlight unit according to the second embodiment of the present invention includes a chamber 410, a backlight 420, circulating fans 430, and a heat-radiating member 440.

The second embodiment of the present invention differs from the first embodiment in that a heat-radiating member 440 is further provided in the backlight unit.

The cooling effect of air circulating on the PCB substrate 422 is increased when air from outside the chamber 410, which is vented into the chamber 410, makes effective contact with the PCB substrate 422. In the second embodiment of the present invention, the heat-radiating member 440 is used to increase the effective contact area between the circulated air and the PCB substrate 422.

Hereinafter, the construction of the second embodiment is described in detail.

The chamber 410, the backlight unit 420 and the circulating fans 430 of the backlight unit according to the second embodiment of the present invention are the same as those of the backlight unit according to the first embodiment of the present invention.

In other words, the high-brightness LEDs 421 of the backlight 420 are packaged on the PCB substrate 422 inside the chamber 410. A plurality of through holes 411 are formed along the perimeter of the chamber 410. Each of the through holes 411 may be provided with the circulating fan 430.

The heat-radiating member 440 is additionally provided along a rear surface of the backlight 420 in a lower surface inside the chamber at the base of the PCB substrate 422 on which the high-brightness LED 421 are packaged.

One surface of the heat-radiating member 440 is in contact with the bottom of the PCB substrate 422 to facilitate the conduction of heat from the PCB substrate 422. The other surface of the heat-radiating member 440 is a heat sink including a plurality of radiating fins 441. The radiating fins 441 may be formed on a single body with the radiating fins 441 spaced apart at predetermined intervals.

Alternatively, the heat-radiating member 440 may be formed of either a heat sink having a plurality of peaks and recesses or of a plurality of thin plates formed at predetermined intervals.

Each of the through holes 411 formed along the perimeter of the chamber 410 has a diameter sufficiently large to allow the air space near the heat-radiating member 440 to communicate with the outside of the chamber.

Hereinafter, the operation of the aforementioned backlight unit according to the second embodiment of the present invention including its air circulating operation will be described.

First, when the backlight unit is controlled to test the LCD panel 10, each high-brightness LED 421 is operated to emit light.

The light emitted from each high-brightness LED 421 is irradiated into the LCD panel 10. As a result, various images are displayed in the LCD panel 10.

While the high-brightness LEDs 421 emit light, each circulating fan 430 is driven to circulate air.

The heat-radiating member 440 provided inside the chamber 410 conducts heat generated during the emission of light by the high-brightness LEDs 421 away from the PCB substrate 422.

Air from outside of the chamber 410 is vented into upper and lower spaces inside the chamber 410 through each through hole 411 as each circulating fan 430 is driven. The air vented into the upper space inside the chamber 410 circulates onto each high-brightness LED 421 and picks up heat generated by the high-brightness LEDs 421. In addition, the air vented into the lower space inside the chamber 410 circulates over the heat-radiating member 440 while flowing in the lower space inside the chamber 410.

The cooling effect of air circulating onto the high-brightness LED 421 and onto the PCB substrate mitigates damage to various circuits on the PCB substrate 422 due to heat generated by emission the high-brightness LED 421.

Figure 7:
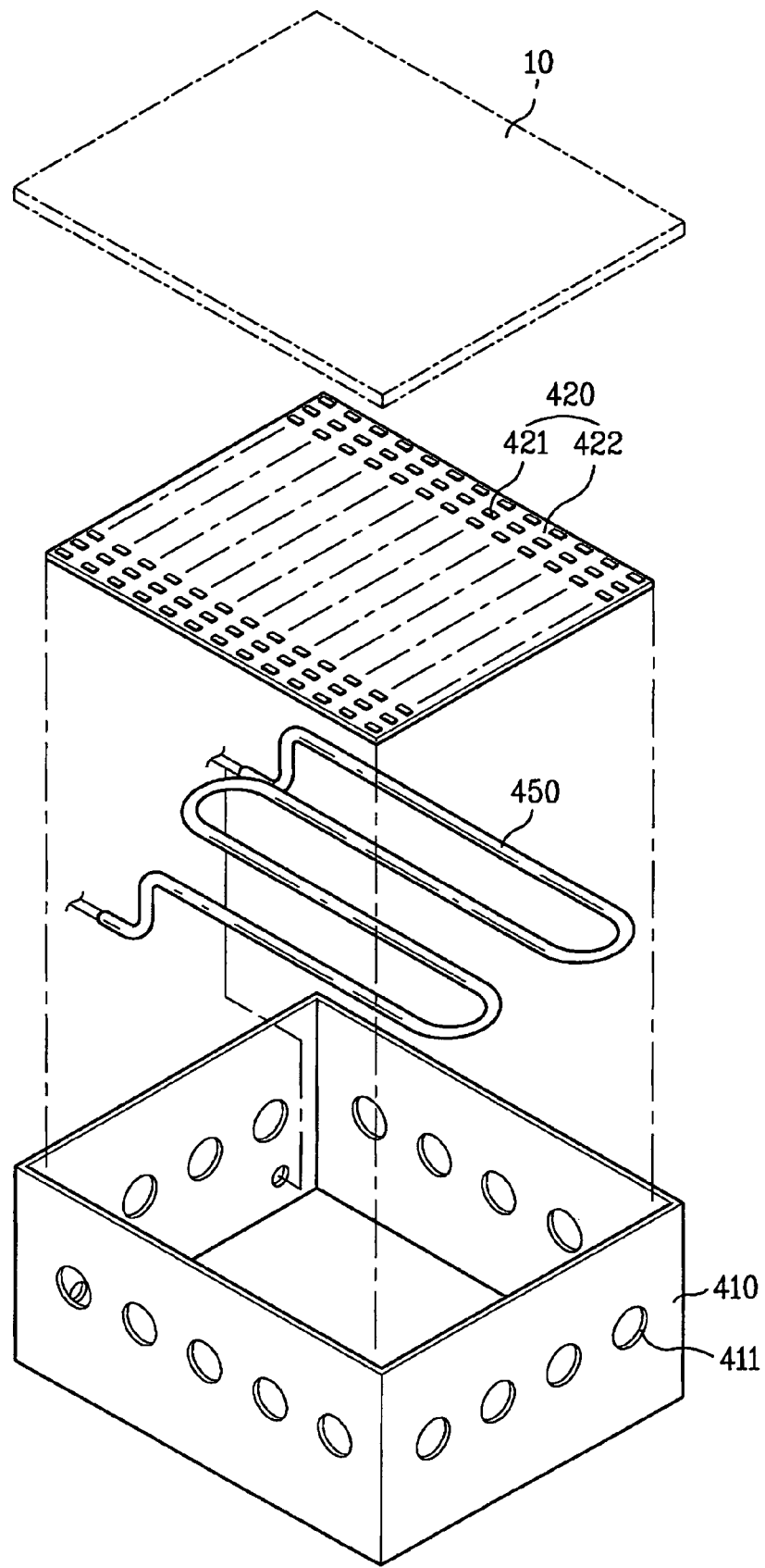
FIG. 7 is an exploded perspective view illustrating a backlight unit for a test device of an LCD panel according to the third embodiment of the present invention.
Figure 8:
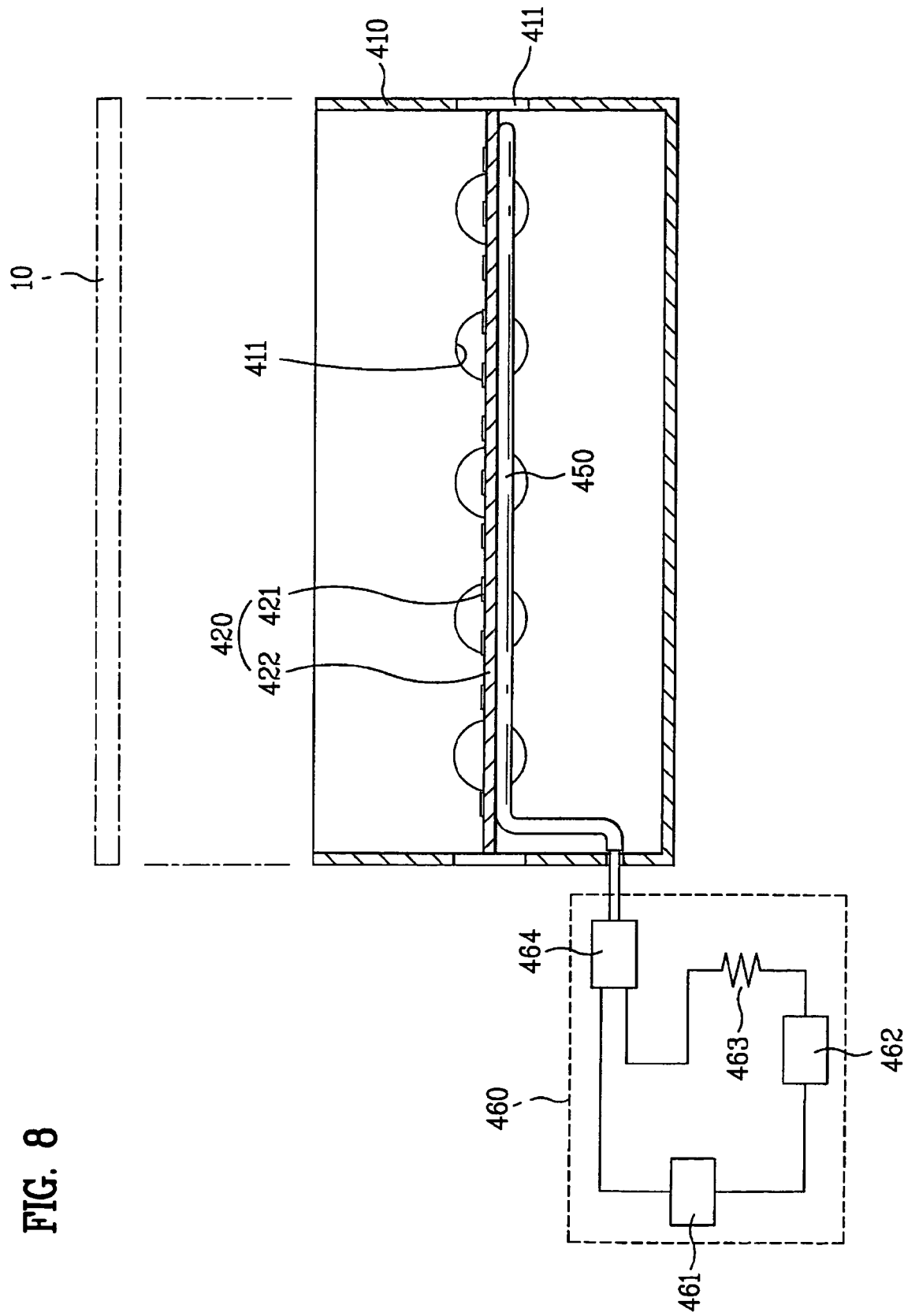
FIG. 8 is a side sectional view illustrating a backlight unit for a test device of an LCD panel according to the third embodiment of the present invention.

FIGS. 7 and 8 illustrate a backlight unit according to a third embodiment of the present invention.

As shown in FIGS. 7 and 8, the backlight unit according to the third embodiment of the present invention includes a chamber 410, a backlight 420, and a refrigerant pipe 450.

In the third embodiment of the present invention, the refrigerant pipe 450 is provided inside the chamber 410 to facilitate cooling of the inside of the chamber 410 of the backlight unit. The refrigerant pipe 450 is designed such that a low temperature refrigerant flows therein.

In other words, the third embodiment of the present invention provides a reduced temperature inside the chamber 410 due to the flow of refrigerant of a low temperature within the refrigerant pipe 450.

Hereinafter, the third embodiment of the invention will be described in more detail.

The chamber 410 and the backlight unit 420 of the backlight unit according to the third embodiment of the present invention are the same as those of the backlight unit according to the first embodiment.

In other words, the high-brightness LEDs 421 of the backlight 420 are packaged on the PCB substrate 422 inside the chamber 410. A plurality of through holes 411 are formed along the perimeter of the chamber 410.

The refrigerant pipe 450 is provided along a rear surface of the backlight 420 inside the chamber 410. That is, the refrigerant pipe 450 is provided below the PCB substrate 422 on which the high-brightness LED 421 are packaged. The refrigerant pipe 450 may have a multi-stage bent shape (zigzag shape). The low temperature refrigerant flows inside the refrigerant pipe 450.

The refrigerant pipe 450 is connected to a separate cooling cycle device 460 provided outside the chamber 410. The cooling cycle device 460, as shown in FIG. 8, includes a compressor 461 for compressing a refrigerant, a condenser 462 for condensing the compressed refrigerant, an evaporator 464 for expanding the condensed refrigerant, and a heat exchanger 464 for removing heat released during expansion of the refrigerant. The refrigerant pipe 450 constitutes the heat exchanger 464. The cooling cycle device 460 may be provided separately from the backlight unit.

The refrigerant pipe 450 may be positioned with its top surface attached to or in close proximity to the bottom of the PCB substrate 422.

The refrigerant pipe 450 may be provided at intervals between high-brightness LEDs 421 inside the chamber 410.

The temperature inside the chamber 410 is reduced by the flow of low temperature refrigerant within the refrigerant pipe 450 even while heat is generated during light emission by the high-brightness LEDs 421 during use of the backlight unit. By placing the PCB substrate 422 in direct thermal contact with the refrigerant pipe 450, damage to circuits on the PCB substrate due to heat may be avoided.

Figure 9:
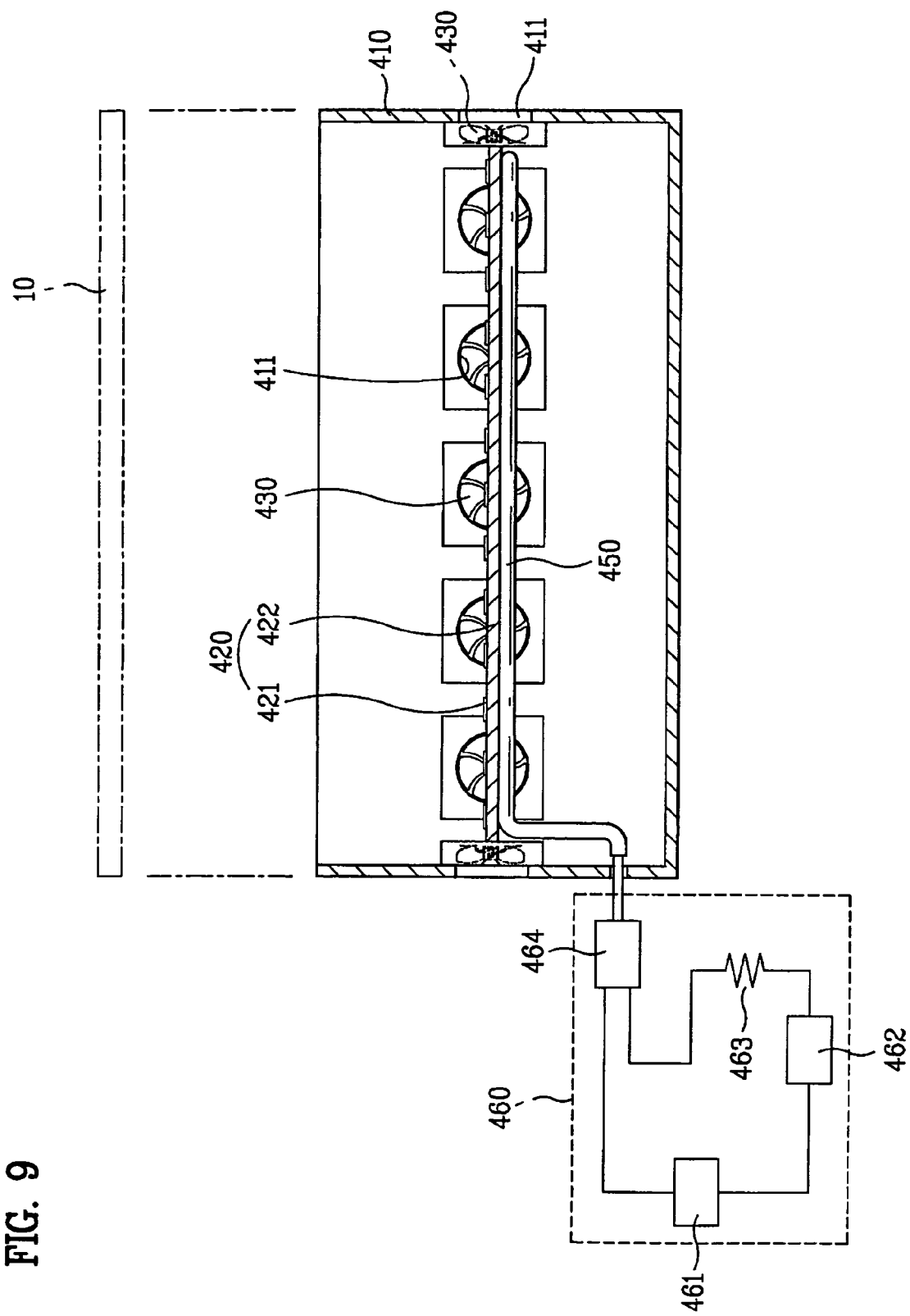
FIGS. 9, 10 and 11 are side sectional views illustrating further examples of a backlight unit for a test device of an LCD panel according to the third embodiment of the present invention.

As shown in FIG. 9, the backlight unit according to the third embodiment of the present invention may further include circulating fans 430 as described in the first embodiment of the present invention.

Figure 10:
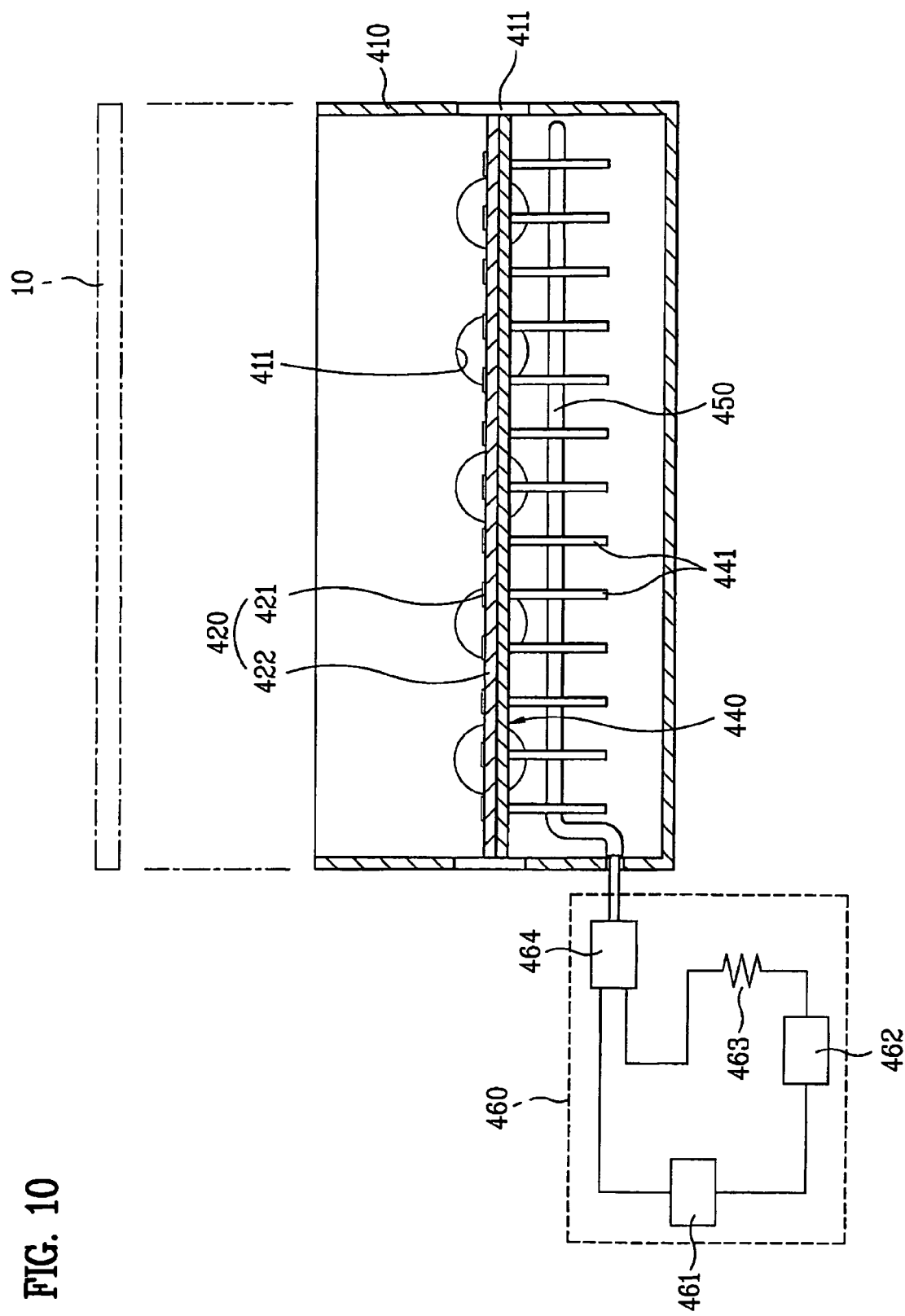
Figure 11:
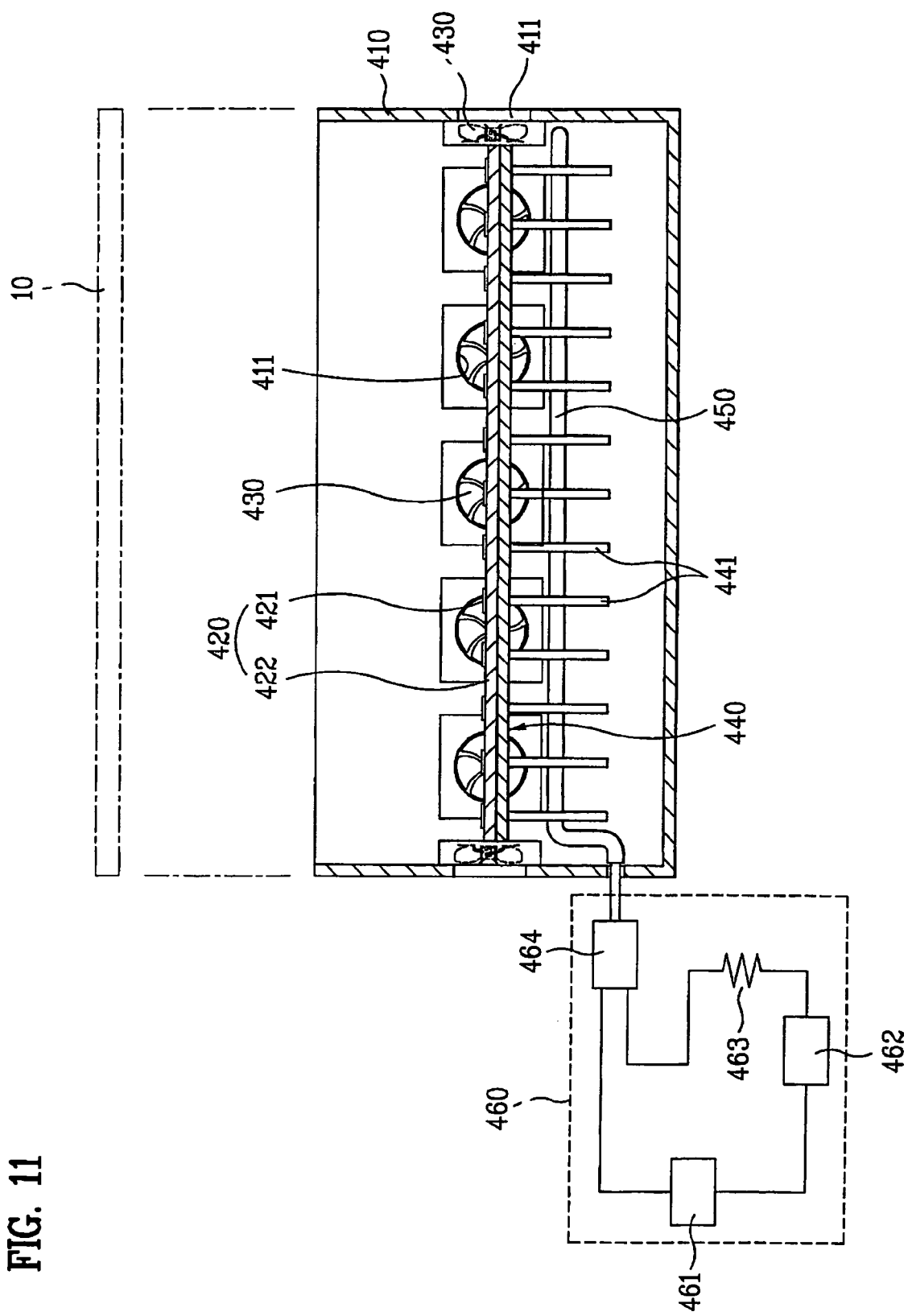

In addition, as shown in FIG. 10, the backlight unit according to the third embodiment of the present invention may further include a heat-radiating member 440 as provided in the second embodiment of the present invention.

When the backlight unit according to the third embodiment of the present invention further includes a heat-radiating member 440, the refrigerant pipe 450 may be positioned to pass through each radiating fin 441 of the heat-radiating member 440 so that the refrigerant within the refrigerant pipe 450 can remove heat through heat exchange with the air inside the chamber 410 through the heat-radiating member 440.

The backlight unit according to the third embodiment of the present invention may include both circulating fans 430 and the heat-radiating member 440.

When the backlight unit according to the above described embodiments of the present invention is operated, the high-brightness LEDs 421 constituting the backlight 420 emit light onto the LCD panel, with the light being diffused at a predetermined lamp angle (for example, 70°).

When the light is diffused at the predetermined lamp angle, the light illuminates the inner portions of the LCD panel under tested is of a relatively high intensity due to overlapping of the illumination from more than one LED. By contrast, since the light illuminating outer of the LCD panel is simply diffused from a single LED without overlap, the illumination intensity at the outer portions of the LCD panel is relatively low.

Therefore, brightness deviations occur between the inner and outer portions of the LCD panel.

Figure 12:
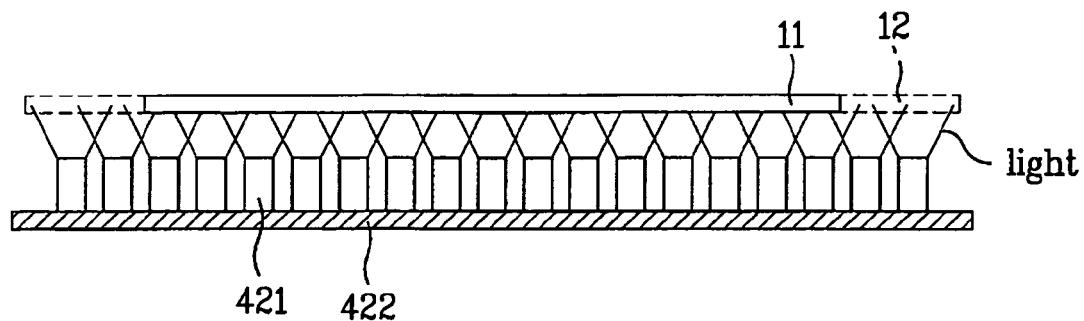
FIG. 12 is a side sectional view illustrating supplying light to an LCD panel using LEDs.

As shown in FIG. 12, a relatively small sized LCD panel 11 (for example, a panel 32 inches in length or less) is uniformly supplied with the light, and the whole portion of the LCD panel 11 may be displayed bright. By contrast, for a relatively large sized LCD panel 12 (for example, a panel 42 inches in length) outer portions of the LCD panel are not sufficiently supplied with the light, resulting in brightness deviations occurring between the inner and outer portions of the LCD panel 12.

The brightness deviations may result in defects of a specific pattern or various foreign matter not being effectively detected.

Figure 13:
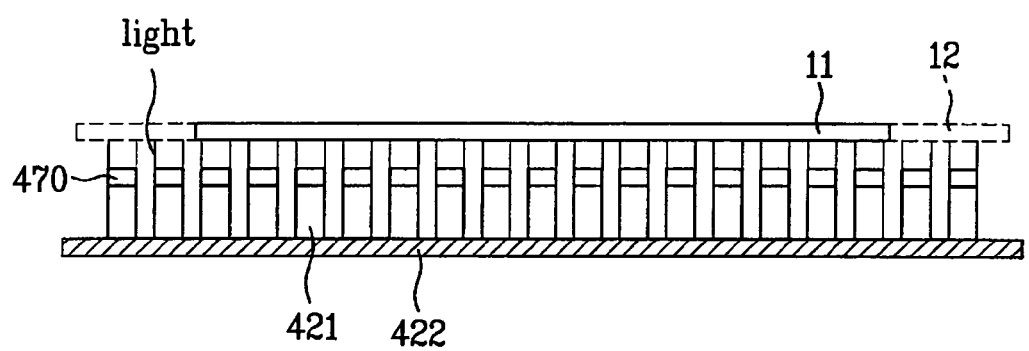
FIG. 13 is a side sectional view illustrating supplying light to an LCD panel using a lens unit according to the fourth embodiment of the present invention.

In the fourth embodiment of the present invention, as shown in FIG. 13, a lens unit 470 is further provided to prevent brightness deviations from occurring. The lens unit 470 according to the fourth embodiment of the present invention is provided at each high-brightness LED 421 to allow the light emitted from each high-brightness LED 421 to be collimated into a directional beam.

The lens unit 470 may comprise an optical lens.

The aforementioned lens unit 470 collimates the light emitted from each high-brightness LED 421 to be emitted to the LCD panels 11 and 12 into a direction beam, so that the light can uniformly be supplied to the entire portion of each of the LCD panels 11 and 12. The uniform supply of light to the LCD panels 11 and 12 prevents brightness deviations occurring between different portions of the LCD panels 11 and 12.

Figure 14:
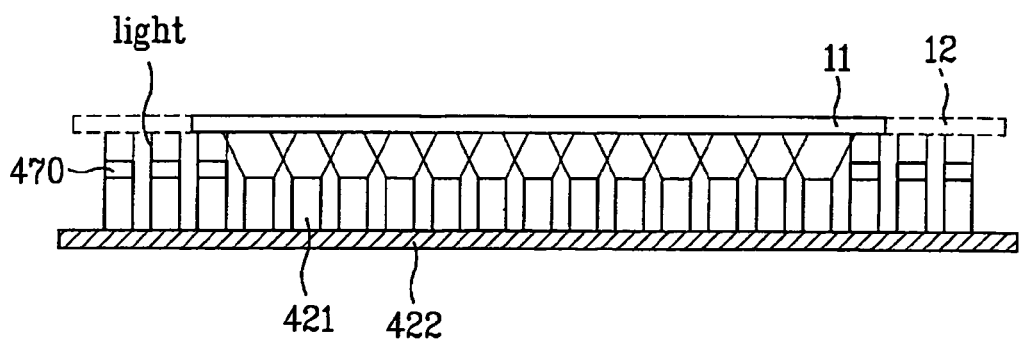
FIG. 14 is a side sectional view illustrating another example of a lens unit according to the fourth embodiment of the present invention.

Alternatively, as shown in FIG. 14, the lens units 470 may be provided at only selected high-brightness LEDs of the light units. For example, the lens units 470 may be provided only at high-brightness LEDs located along the outer portions of the PCB substrate 422.

The structure of the backlight unit according to the fourth embodiment of the present invention may be applied to the structures of the backlight unit according to the first to third embodiments of the present invention. Alternatively, the structure of the backlight unit according to the fourth embodiment of the present invention may be provided separately from the structures of the backlight unit according to the first to third embodiments of the present invention.

It is to be understood that the backlight unit for a test device of an LCD panel according to the present invention is a useful invention in which various modifications may be made as occasions demand.

As described above, the described embodiments of the backlight unit for a test device of an LCD panel according to the present invention have the following advantages.

First, when the backlight unit comprises high-brightness LEDs, it is possible to prevent lifetime of the backlight from decreasing with frequent blinking on and off of the backlight, reducing the cost associated with replacing the backlight.

Secondly, by providing the backlight unit with an air circulating structure, it is possible to preserve lifetime of the backlight even though a great quantity of heat is generated inside the chamber during light emission from the backlight.

Further, although the PCB substrate provided with the high-brightness LEDs is sensitive to heat generated during light emission by the high-brightness LEDs, by removing heat removed from the PCB substrate using the circulating fans, the heat-radiating member, or the low temperature refrigerant, it is possible to avoid damage to the various circuits on the PCB substrate.

Finally, since the light emitted from the backlight is collimated into a directional beam, light is uniformly supplied to the LCD panel, thereby obtaining uniform brightness over the whole portions of the LCD panel. As a result, the LCD panel can be more effectively tested for pattern defects or various foreign matter in the LCD panel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A backlight unit for a test device of an LCD panel comprising:

a chamber having four side walls and a predetermined space therein; a plurality of through holes formed in each of the sidewalls around the perimeter of the chamber to communicate between a space inside chamber space and a space exterior to the chamber;

a backlight provided in the chamber to emit a light to an LCD panel positioned in the chamber;

a plurality of circulating fans provided through each of the sidewalls such that a circulating fan is located in each of the through holes in the chamber sidewalls to circulate air through the chamber a refrigerant pipe provided inside the chamber to flow a low temperature refrigerant therein; and a heat-radiating member provided inside the chamber to radiate heat transmitted from the backlight, wherein the heat-radiating member is provided along a rear surface of the backlight in a lower space inside the chamber, wherein the heat-radiating member has one surface contacting the backlight to transmit heat thereto, and another surface being a heat sink on which a plurality of radiating fins are formed, wherein the refrigerant pipe is provided along the lower space inside the chamber in a multi-stage bent shape to conduct heat away from the space inside the chamber, wherein the refrigerant pipe is provided to pass through the respective radiating fins to exchange heat between refrigerant within the refrigerant pipe and air inside the chamber through the respective radiating fins, wherein the refrigerant pipe is apart from the one surface of the heat-radiating member.

2. The backlight unit as claimed in claim 1, wherein the backlight comprises a plurality of high-brightness LEDs packaged on a PCB substrate.

3. The backlight unit as claimed in claim 2, further comprising a lens unit provided at each high-brightness LED to collimate light emitted by each high-brightness LED into a directional beam.

4. The backlight unit as claimed in claim 2, further comprising a lens unit provided only at high-brightness LEDs along an outer portion of the PCB substrate to collimate light emitted by each high-brightness LED into a directional beam.

5. The backlight unit as claimed in claim 3, wherein the lens unit comprises an optical lens.

6. The backlight unit as claimed in claim 1, wherein the circulating fans vent air inside the chamber to the outside of the chamber through the through holes to remove from the space inside the chamber.

7. The backlight unit as claimed in claim 1, wherein the circulating fans vent the air outside the chamber to the inside of the chamber through the respective through holes.

8. The backlight unit as claimed in claim 1, wherein some circulating fans vent the air inside the chamber to the outside of the chamber through respective through holes, and the other circulating fans vent the air outside the chamber to the inside of the chamber through respective through holes.

9. A backlight unit for a test device of an LCD panel comprising:
a chamber having four side walls and a predetermined space therein; a plurality of through holes formed in each of the sidewalls around the perimeter of the chamber to communicate between a space inside chamber space and a space exterior to the chamber;
a plurality of high-brightness LEDs provided inside the chamber to emit a light to the LCD panel;
a PCB substrate packaged with the respective high-brightness LEDs;
a plurality of circulating fans provided through each of the sidewalls such that a circulating fan is located in each of the through holes in the chamber sidewalls to circulate air through the chamber
a refrigerant pipe provided inside the chamber to flow a refrigerant of a low temperature therein; and
a heat-radiating member provided inside the chamber, the heat-radiating member having one surface contacting the bottom of the PCB substrate to transmit heat thereto and its other surface having a plurality of radiating fins in a single body at predetermined intervals,
wherein the heat-radiating member is provided along a rear surface of the backlight in a lower space inside the chamber,
wherein the refrigerant pipe is provided along the lower space inside the chamber in a multi-stage bent shape to conduct heat away from the space inside the chamber,
wherein the refrigerant pipe is provided along the respective radiating fins of the heat-radiating member to exchange heat between refrigerant in the refrigerant pipe and air inside the chamber through the heat-radiating member,
wherein the refrigerant pipe is provided to pass through the respective radiating fins, wherein the refrigerant pipe is apart from the one surface of the heat-radiating member.

10. A backlight unit for a test device of an LCD panel comprising:
a chamber having four side walls and a predetermined space therein; a plurality of through holes formed in each of the sidewalls around the perimeter of the chamber to communicate between a space inside chamber space and a space exterior to the chamber;
a backlight having a plurality of high-brightness LEDs packaged on a PCB substrate inside the chamber to emit a light to the LCD panel;
a lens unit provided at each high-brightness LED to collimate light emitted by each high-brightness LED into a directional beam;
a plurality of circulating fans provided through each of the sidewalls such that a circulating fan is located in each of the through holes in the chamber sidewalls to circulate air through the chamber
a refrigerant pipe provided inside the chamber to flow a refrigerant of a low temperature therein; and
a heat-radiating member provided inside the chamber, the heat-radiating member having one surface contacting the bottom of the PCB substrate to transmit heat thereto and its other surface having a plurality of radiating fins in a single body at predetermined intervals,
wherein the heat-radiating member is provided along a rear surface of the backlight in a lower space inside the chamber,
wherein the refrigerant pipe is provided along the lower space inside the chamber in a multi-stage bent shape to conduct heat away from the space inside the chamber,
wherein the refrigerant pipe is provided along the respective radiating fins of the heat-radiating member to exchange heat between refrigerant in the refrigerant pipe and air inside the chamber through the heat-radiating member,
wherein the refrigerant pipe is provided to pass through the respective radiating fins, wherein the refrigerant pipe is apart from the one surface of the heat-radiating member.

11. The backlight unit as claimed in claim 10, wherein the lens unit comprises an optical lens.

12. A backlight unit for a test device of an LCD panel comprising:
a chamber having four side walls and a predetermined space therein; a plurality of through holes formed in each of the sidewalls around the perimeter of the chamber to communicate between a space inside chamber space and a space exterior to the chamber;
a backlight having a plurality of high-brightness LEDs packaged on a PCB substrate inside the chamber to emit a light to the LCD panel; and
a lens unit provided only in some high-brightness LEDs along an outer portion of the PCB substrate to collimate light emitted by each high-brightness LED into a directional beam;
a plurality of circulating fans provided through each of the sidewalls such that a circulating fan is located in each of the through holes in the chamber sidewalls to circulate air through the chamber
a refrigerant pipe provided inside the chamber to flow a low temperature refrigerant therein; and
a heat-radiating member provided inside the chamber to radiate heat transmitted from the backlight, wherein the heat-radiating member has one surface contacting the backlight to transmit heat thereto, and another surface being a heat sink on which a plurality of radiating fins are formed, wherein the refrigerant pipe is provided to pass through the respective radiating fins to exchange heat between refrigerant within the refrigerant pipe and air inside the chamber through the respective radiating fins.

* * * * *